US011206867B2

(12) United States Patent
Li et al.

(10) Patent No.: US 11,206,867 B2
(45) Date of Patent: Dec. 28, 2021

(54) VARIABLE-FREQUENCY SURFACE ACOUSTIC WAVE ELECTRONIC CIGARETTE

(71) Applicant: CHINA TOBACCO YUNNAN INDUSTRIAL CO., LTD, Kunming (CN)

(72) Inventors: Tinghua Li, Kunming (CN); Yulin Lei, Kunming (CN); Yi Han, Kunming (CN); Jun Wu, Kunming (CN); Yongkuan Chen, Kunming (CN); Donglai Zhu, Kunming (CN); Hong Hu, Kunming (CN); Jianguo Tang, Kunming (CN); Shoubo Li, Kunming (CN); Wei Zhao, Kunming (CN); Xia Zhang, Kunming (CN); Liu Hong, Kunming (CN); Xiaowei Gong, Kunming (CN); Xi Lv, Kunming (CN)

(73) Assignee: CHINA TOBACCO YUNNAN INDUSTRIAL CO., LTD, Kunming (CN)

( * ) Notice: Subject to any disclaimer, the term of this patent is extended or adjusted under 35 U.S.C. 154(b) by 0 days.

(21) Appl. No.: 17/270,452

(22) PCT Filed: Mar. 25, 2020

(86) PCT No.: PCT/CN2020/081117

§ 371 (c)(1),
(2) Date: Feb. 23, 2021

(87) PCT Pub. No.: WO2021/073045

PCT Pub. Date: Apr. 22, 2021

(65) Prior Publication Data

US 2021/0329971 A1 Oct. 28, 2021

(30) Foreign Application Priority Data

Feb. 26, 2020 (CN) ........................ 202010120537.7

(51) Int. Cl.
*H03H 9/02* (2006.01)
*B06B 3/00* (2006.01)
(Continued)

(52) U.S. Cl.
CPC .............. *A24F 40/05* (2020.01); *A24F 40/10* (2020.01); *A24F 40/44* (2020.01); *A24F 40/46* (2020.01);
(Continued)

(58) Field of Classification Search
CPC .......... A24F 40/05; A24F 40/60; A24F 40/10; A24F 40/48; A24F 40/44; A24F 40/46;
(Continued)

(56) References Cited

U.S. PATENT DOCUMENTS 4,878,036 A * 10/1989 Yatsuda ............ H03H 9/02645 333/195
4,973,875 A * 11/1990 Yatsuda ............ H03H 9/02787 310/313 B
(Continued)

FOREIGN PATENT DOCUMENTS

CN 107819448 A 3/2018
CN 108030153 A 5/2018
(Continued)

*Primary Examiner* — J. San Martin
(74) *Attorney, Agent, or Firm* — Bayramoglu Law Offices LLC

(57) ABSTRACT

A variable-frequency surface acoustic wave electronic cigarette includes an atomizer. An atomization cavity is disposed in the atomizer, and a variable-frequency surface acoustic wave atomization chip is disposed at a lower portion of the atomization cavity. An inverted trapezoidal interdigital transducer is disposed on the variable-frequency surface acoustic wave atomization chip. An e-liquid storage cavity is disposed in the atomization cavity. A porous ceramic sheet is disposed between the e-liquid storage cavity and the
(Continued)

atomization chip. The new variable-frequency surface acoustic wave electronic cigarette can realize any adjustment of the working frequency within a set range, thereby realizing the autonomous regulation and control of a smoke particle size after atomization of the e-liquid.

7 Claims, 3 Drawing Sheets

(51) Int. Cl.

| | |
|---|---|
| ***A24F 40/05*** | (2020.01) |
| ***B06B 1/02*** | (2006.01) |
| ***A24F 40/46*** | (2020.01) |
| ***A24F 40/10*** | (2020.01) |
| ***A24F 40/44*** | (2020.01) |
| ***A24F 40/60*** | (2020.01) |
| ***A24F 40/90*** | (2020.01) |
| ***B05B 17/06*** | (2006.01) |
| ***A24F 40/48*** | (2020.01) |

(52) U.S. Cl.
CPC .............. *A24F 40/48* (2020.01); *A24F 40/60* (2020.01); *A24F 40/90* (2020.01); *B05B 17/0607* (2013.01); *B06B 1/0284* (2013.01); *B06B 3/00* (2013.01); *B06B 2201/55* (2013.01); *B06B 2201/77* (2013.01)

(58) Field of Classification Search
CPC ......... A24F 40/90; B06B 3/00; B06B 1/0284; B06B 2201/55; B06B 2201/77; B05B 17/0607
See application file for complete search history.

(56) References Cited

U.S. PATENT DOCUMENTS

| | | | | |
|---|---|---|---|---|
| 6,856,214 | B2 * | 2/2005 | Jian | H03H 9/0042 310/313 B |
| 2004/0246076 | A1 * | 12/2004 | Bergmann | H03H 9/14532 333/193 |
| 2015/0270826 | A1 | 9/2015 | Burak | |
| 2017/0280771 | A1 * | 10/2017 | Courbat | B05B 17/0669 |
| 2018/0102760 | A1 * | 4/2018 | Inoue | H03H 9/02992 |

FOREIGN PATENT DOCUMENTS

| | | | |
|---|---|---|---|
| CN | 208353309 | U | 1/2019 |
| CN | 109480335 | A | 3/2019 |
| CN | 110587977 | A | 12/2019 |

* cited by examiner

VARIABLE-FREQUENCY SURFACE ACOUSTIC WAVE ELECTRONIC CIGARETTE

CROSS REFERENCE TO THE RELATED APPLICATIONS

This application is the national phase entry of International Application No. PCT/CN2020/081117, filed on Mar. 25, 2020, which is based upon and claims priority to Chinese Patent Application No. 202010120537.7, filed on Feb. 26, 2020, the entire contents of which are incorporated herein by reference.

TECHNICAL FIELD

The present invention belongs to the technical field of electronic cigarettes, and more particularly, relates to a variable-frequency surface acoustic wave electronic cigarette.

BACKGROUND

At present, electrically-heated atomizing electronic cigarettes occupy the mainstream market of electronic cigarettes. They use resistance wires for heating to generate localized high temperatures so that the e-liquid in the cotton core or porous ceramic sheet is atomized to form an aerosol for users to smoke. The electrically-heated atomizing electronic cigarette has a substantial rate of heat conduction and atomization efficiency. Under the action of high temperature, however, harmful substances such as formaldehyde, carbon monoxide and others are easily produced, which not only causes health and safety risks, but also greatly reduces the experience of smoking. Another type of electronic cigarette is an ultrasonic atomizing electronic cigarette. The ultrasonic atomizing electronic cigarette requires a thin layer of e-liquid to be evenly spread on an entire surface of an atomizing sheet to realize atomization. If the e-liquid accumulates, the amount of smoke created will vary, sometimes large and sometimes small during use of the electronic cigarette, and even the smoke with a large particle size will be produced. When such smoke is inhaled into the mouth along an airflow channel by the user, it will reduce the user experience. In addition, the amount of smoke through the pure ultrasonic atomization is smaller than that of the electrically-heated atomization, and an auxiliary ceramic heating sheet is required to increase the amount of smoke to satisfy the user's experience demand for hot smoke.

In order to solve the aforementioned problems, the applicant designed an electronic cigarette system, which uses a surface acoustic wave to achieve atomization of e-liquid (refer to the Chinese Patent ZL201810076941.1). The electronic cigarette system effectively prevents the potential safety and health risks caused by rapid high heat of the electrically-heated atomization, and solves the problems of high consumption, lower efficiency and poor experience of the ultrasonic atomization. After atomization of the e-liquid using such system, however, the smoke particle size is basically determined and cannot be adjusted arbitrarily, thereby affecting the smoking experience.

In order to solve the above problems, the present invention is proposed.

SUMMARY

The present invention provides a variable-frequency surface acoustic wave electronic cigarette, which realizes atomization of e-liquid using the diffraction energy of the surface acoustic wave, and enables a range of a surface acoustic wave frequency to be adjustable through a structural design of a special atomization chip to further realize the effective adjustment of a smoke particle size after the atomization of the e-liquid. The electronic cigarette of the present invention has a simple overall structure, convenient assembly, and high atomization efficiency, and can effectively satisfy users' different smoking experiences.

The present invention provides a variable-frequency surface acoustic wave electronic cigarette, which includes an atomizer. An atomization cavity is disposed in the atomizer, and a variable-frequency surface acoustic wave atomization chip is disposed at a lower portion of the atomization cavity. An inverted trapezoidal interdigital transducer is disposed on the variable-frequency surface acoustic wave atomization chip. An e-liquid storage cavity is disposed in the atomization cavity. A porous ceramic sheet is disposed between the e-liquid storage cavity and the atomization chip.

Preferably, the inverted trapezoidal interdigital transducer includes a plurality of first metal interdigital electrodes, a plurality of second metal interdigital electrodes and a plurality of reflective electrodes, which are in an inverted trapezoidal shape. The inverted trapezoidal interdigital transducer further includes two metal electrode bus bars, namely a first metal electrode bus bar and a second metal electrode bus bar. A plurality of first metal interdigital electrodes are connected to the first metal electrode bus bar through a relatively long trapezoidal bottom, and a plurality of second metal interdigital electrodes are connected to the second metal electrode bus bar through a relatively short trapezoidal bottom. The plurality of first metal interdigital electrodes and the plurality of second metal interdigital electrodes are arranged in a finger-crossed shape, and a reflective electrode is embedded between a first metal interdigital electrode and a second metal interdigital electrode.

Preferably, an arrangement manner of the metal interdigital electrodes and reflective electrodes is: the first metal interdigital electrode, a first gap, the second metal interdigital electrode, a second gap, the reflective electrode, a third gap, the first metal interdigital electrode, . . . . The above arrangement continues in a plurality of groups to constitute the inverted trapezoidal interdigital transducer. An average width of the first gap is identical to an average width of the first metal interdigital electrode. An average width of the second gap is identical to an average width of the second metal interdigital electrode. An average width of the third gap is identical to an average width of the reflective electrode.

Preferably, a shape of the first metal interdigital electrode and a shape of the second metal interdigital electrode are identical. The sum of the average width of the first metal interdigital electrode, the average width of the first gap, the average width of the second metal interdigital electrode, the average width of the second gap, the average width of the reflective electrode and the average width of the third gap is a wavelength p of the surface acoustic wave. It is satisfied that the average width of the first metal interdigital electrode, or the average width of the first gap, or the average width of the second metal interdigital electrode or the average width of the second gap is one eighth of the wavelength of the surface acoustic wave, and the average width of the third gap or the average width of the reflective electrode is a quarter of the wavelength of the surface acoustic wave.

Preferably, the atomization chip further successively includes: a heat sink layer, a heat conduction layer and a piezoelectric substrate layer. The inverted trapezoidal interdigital transducer is disposed on the piezoelectric substrate layer. Two separate printed circuit board PCB bonding pads, namely a first PCB bonding pad and a second PCB bonding pad, are further disposed on the piezoelectric substrate layer. The first metal electrode bus bar is connected to the first PCB bonding pad through a power connection wire, and the second metal electrode bus bar is connected to the second PCB bonding pad through a power connection wire.

Preferably, the electronic cigarette further includes an electric core. A circuit board and a battery are disposed in the electric core, and the electric core is conductively connected to the first PCB bonding pad and the second PCB bonding pad through a magnetic thimble.

Preferably, the atomizer is provided with an atomizer housing. An airflow channel is disposed inside the atomizer housing, and a suction nozzle is disposed outside the atomizer housing. The suction nozzle is in communication with and connected to the airflow channel. An airflow inlet is formed on the atomizer housing, and the airflow inlet and the inverted trapezoidal interdigital transducer are on an identical horizontal plane.

Preferably, the electronic cigarette further includes a protective shell. The electric core is disposed in the protective shell. A button, an indicator light and a charging port are disposed outside the protective shell.

The present invention has the following advantages.

1. The surface acoustic wave is a kind of mechanical wave, of which energy is concentrated on the surface. The energy loss in a propagation direction is small (even negligible without interference from other medias). The energy is exponentially attenuated in a direction perpendicular to the propagation direction of the wave. The range of the vibration frequency of the surface acoustic wave is as high as GHz, and is an order of magnitude higher than an ultrasound wave. In the e-liquid atomization system based the vibration of the substrate, the smoke particle size is directly related to the vibration frequency, which satisfies $D=K\gamma H^2 We^{2/3}/\mu L^2 f$, where D is an atomized smoke particle size, K is a proportional coefficient, $\gamma$ is a surface tension of atomized fluid, H is a characteristic height of a fluid film to be atomized, We is an acoustic Weber number, $\mu$ is a dynamic viscosity coefficient of the fluid, L is a characteristic width of the fluid to be atomized, and f is a vibration frequency of the substrate). It is easy to discover that the smoke particle size is inversely proportional to the vibration frequency. Thus, such a high frequency of the surface acoustic wave makes its atomized smoke particle size much smaller than the atomized smoke particle size of the ultrasonic wave. In this way, the problems of deposition in the lung and damage to the body caused by the inhalation of smoke with the large particle size are not only reduced effectively, but also the taste of the e-liquid increases as the smoke particle size decreases to increase the user's smoking experience.

2. The atomization chip in the present invention adopts a structure of one-way apodization interdigital electrode through electrode width control. The inventive point lies in adopting the electrode width control method, that is, the reflective electrode is embedded inside the inverted trapezoidal interdigital transducer to enable the acoustic wave to only propagate along a single direction, so that the whole energy of the acoustic wave are all used to atomize the e-liquid. Moreover, a finger-shaped strip structure of the metal interdigital electrode is converted into an inverted trapezoidal structure in which the width of the electrode gradually changes from top to bottom, so that the frequency of the atomization chip is no longer singly fixed, but has a variable-frequency range. In this way, the user can adjust the frequency range arbitrarily according to personal needs to obtain the atomized smoke with different particle sizes, which not only can satisfy the user's personalized needs for the smoke particle size, but also can bring the user different smoking experiences.

3. When the variable-frequency surface acoustic wave electronic cigarette of the present invention is used, under the premise that the normal sucking function of the electronic cigarette is satisfied, a temperature of the surface of the atomization chip is maintained at about 100° C., which is much lower than a heating and atomizing temperature (180-350° C.) of the electrically-heated atomizing electronic cigarette, so the safety hazard problems such as the release of aldehyde chemicals, carbonization, and core burning caused by the electrically-heated high temperature can be effectively prevented. In additionally, compared with the cold smoke produced by the ultrasonic atomizing electronic cigarette, the smoke produced by the surface acoustic wave electronic cigarette has a better temperature experience.

4. The variable-frequency surface acoustic wave atomization chip of the present invention adopts a lithium niobate single crystal atomization chip, and the atomization chip can maintain a normal working mode when its surface is not in contact with the e-liquid, which is represented in the transmission and reflection of mechanical waves on the surface of the atomization chip, and the phenomenon of dry burning produced when the supply of e-liquid is insufficient does not occur. Therefore, the variable-frequency surface acoustic wave electronic cigarette of the present invention will not affect or damage the atomization chip and the atomizer when the e-liquid is exhausted, and is thus stable and reliable.

5. The variable-frequency surface acoustic wave electronic cigarette of the present invention adopts a light porous ceramic sheet with high porosity to realize the guiding and locking of the e-liquid. The e-liquid is sucked out from the porous ceramic sheet by the surface acoustic wave during atomization to automatically form a liquid film between the porous ceramic sheet and the atomization chip, and an atomizing function is performed in an area of the liquid film. When the atomization chip stops working, the e-liquid will automatically retract into the porous ceramic sheet. Therefore, the variable-frequency surface acoustic wave electronic cigarette of the present invention can effectively avoid the problems existing in the ultrasonic atomizing electronic cigarette, that is, the fluctuations of the amount of smoke or relatively large smoke particle sizes caused by uneven distribution of the e-liquid or accumulation of the e-liquid can be avoided.

Reference signs: 1. suction nozzle; 2. atomizer; 3. electric core; 4. e-liquid injection hole; 5. button; 6. indicator light; 201. bottom board; 202. silicone gasket; 203. atomization chip; 204. porous ceramic sheet; 205. e-liquid storage cavity; 206. silicone sealing sheet; 207. first screw; 208. airflow channel; 209. atomizer housing; 210. airflow inlet; 211. atomization chip stopper; 212. magnetic thimble; 213. atomization cavity; 301. protective shell; 302. charging port; 303. stop body; 304. screw cap; 305. battery; 306. second screw; 307. circuit board; 308. bottom cover; 401. silicone e-liquid injection hole plug; 402. e-liquid injection round hole; 2031. heat sink; 2032. heat conduction layer; 2033. piezoelectric substrate layer; 20341. first PCB bonding pad; 20342. second PCB bonding pad; 2035. power connection wire; 20361. first metal electrode bus bar; 20362. second metal electrode bus bar; 2037. inverted trapezoidal interdigital transducer; a. first metal interdigital electrode; b. second metal interdigital electrode; c. reflective electrode; $d_1$. first gap; $d_2$. second gap; $d_3$. third gap; p. wavelength of surface acoustic wave; and W. internal range of inverted trapezoidal interdigital transducer.

DETAILED DESCRIPTION OF THE EMBODIMENTS

In order to make the objects, technical solutions and advantages of the present invention clearer, the present invention will be further explained below in conjunction with the drawings and embodiments.

Figure 1:
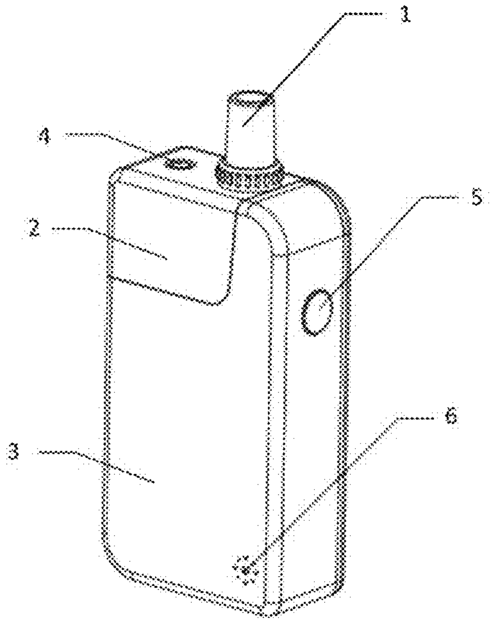
FIG. 1 is a schematic diagram of the structure of a variable-frequency surface acoustic wave electronic cigarette of the present invention.

FIG. 1 shows a schematic diagram of the structure of a variable-frequency surface acoustic wave electronic cigarette of the present invention, which includes the suction nozzle 1, the atomizer 2, the electric core 3, the e-liquid injection hole 4, the button 5 and the indicator light 6. The atomizer 2 and the electric core 3 are firmly contiguously connected through the magnetic thimble 212. The suction nozzle 1 is configured for the user to smoke the smoke. The atomizer 2 is configured to atomize the e-liquid to produce the smoke. The electric core 3 is configured to provide a drive signal source to the atomizer 2. The e-liquid injection hole 4 is configured to fill the e-liquid. The button 5 is configured to realize operations of turning the electronic cigarette on and off, adjusting a frequency of the drive signal source and controlling an output of the signal source, and other operations. The indicator light 6 is configured to display the working status and electric quantity of the electronic cigarette.

Figure 2:
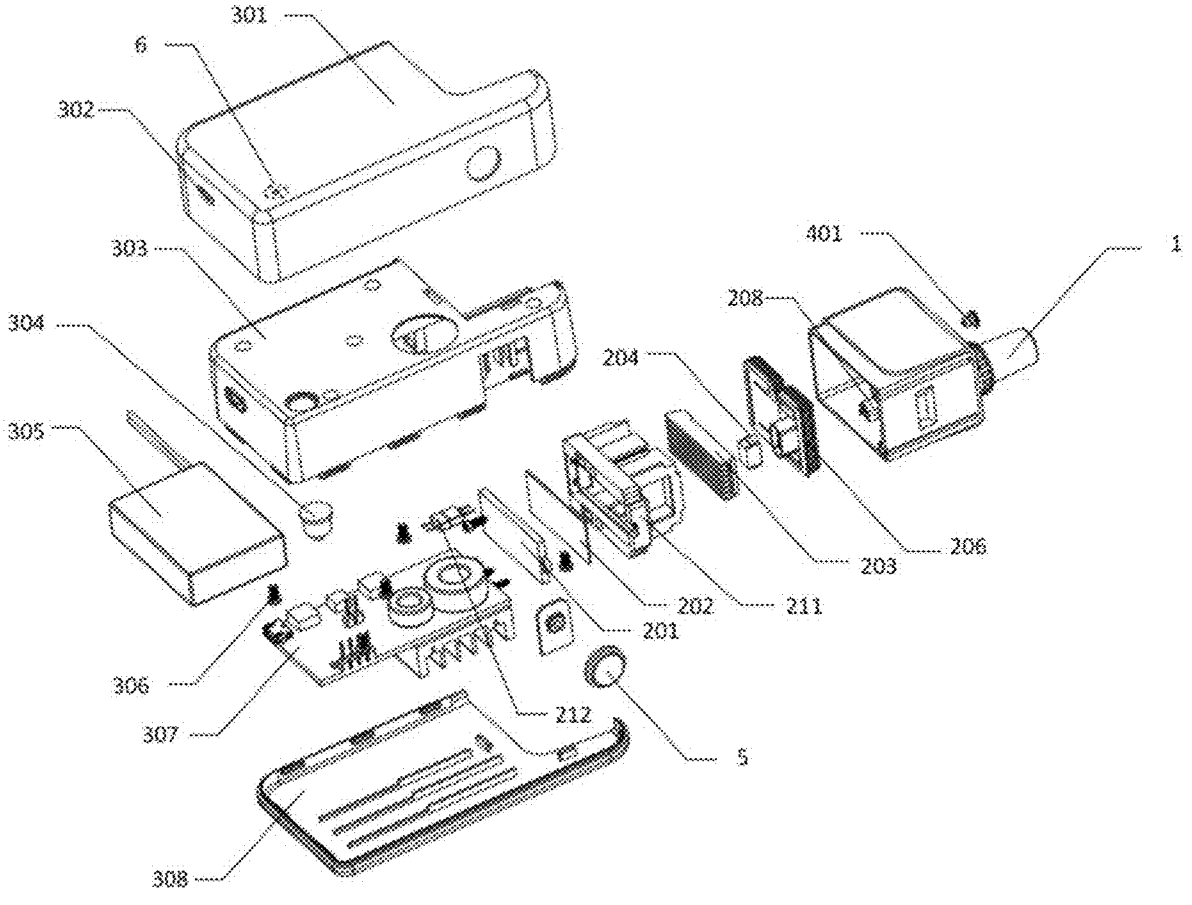
FIG. 2 is an exploded view of the variable-frequency surface acoustic wave electronic cigarette of the present invention.

FIG. 2 shows an exploded view of the variable-frequency surface acoustic wave electronic cigarette of the present invention. The suction nozzle 1 is located on the top of the atomizer 2. An internal structure of the atomizer includes the bottom board 201, the silicone gasket 202, the variable-frequency surface acoustic wave atomization chip 203, the porous ceramic sheet 204, the e-liquid storage cavity 205, the silicone sealing sheet 206, the first screw 207, the airflow channel 208, the atomizer housing 209, the airflow inlet 210, the atomization chip stopper 211, the magnetic thimble 212 and the atomization cavity 213. The electric core 3 is provided with the protective shell 301, the charging port 302, the stop body 303, the screw cap 304, the battery 305, the second screw 306, the circuit board 307 and the bottom cover 308. The e-liquid injection hole 4 is located on the top of the atomizer 2 and located on a side of the suction nozzle 1, and includes the silicone e-liquid injection hole plug 401 and the e-liquid injection round hole 402 located on the top of the atomizer. The button 5 is located on a side of the protective shell 301 of the electric core 3. The indicator light 6 is located on the lower right side of the protective shell 301 of the electric core 3. The atomization chip 203 successively includes the heat sink 2031, the heat conduction layer 2032, the piezoelectric substrate layer 2033, the first printed circuit board (PCB) bonding pad 20341, the second PCB bonding pad 20342, the power connection wire 2035, the first metal electrode bus bar 20361, the second metal electrode bus bar 20362, and the inverted trapezoidal interdigital transducer 2037. The atomizer housing 209 of the atomizer 2 and the protective shell 301 and the bottom cover 308 of the electric core 3 are all made of aluminum alloy materials having good heat conduction and heat dissipation effects. The porous ceramic sheet 204 is made of silicate materials having good porosity (the porosity is generally in the range of 40%-70%), high temperature and high pressure resistance and acid and alkali corrosion resistance. The heat sink 2031 is made of aluminum sheet having an excellent heat dissipation effect and a low cost, and the bottom of the heat sink 2031 is provided with grooves. The heat conduction layer 2032 is made of heat conduction silicone grease sheets having good bonding performance and heat conduction capability. The piezoelectric substrate layer 2033 selects a 128° lithium niobate single crystal chip propagating in a direction of Y being tangent to X, with a thickness of 1 mm-2 mm, an electromechanical coupling coefficient of 5.5%, a propagation velocity of the surface acoustic wave of about 3990 m/s, and a temperature coefficient of $-72\times10-6/°$ C. The power connection wire 2035 employs a gold wire or a silver wire, which has a diameter of reaching 100 μm and can be used for a binding process. The first metal electrode bus bar 20361, the second metal electrode bus bar 20362 and the metal interdigital electrodes a and b are made of aluminum, silver, gold or other materials having good electrical conductivity. The structure of the metal interdigital electrodes a and b employs an apodization structure having crossed metal strips with a wide top and a narrow bottom, namely an inverted trapezoidal structure.

Figure 3:
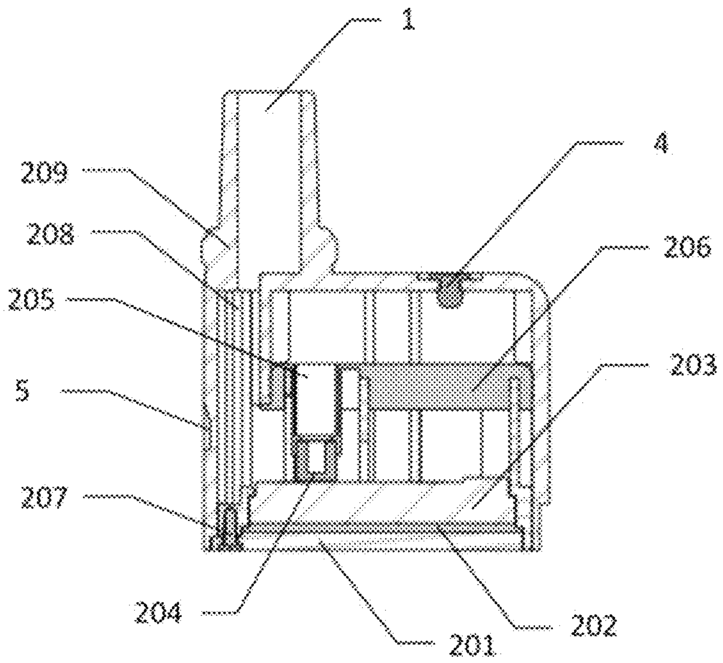
FIG. 3 is a cross-sectional view of an atomizer of the present invention.
Figure 4:
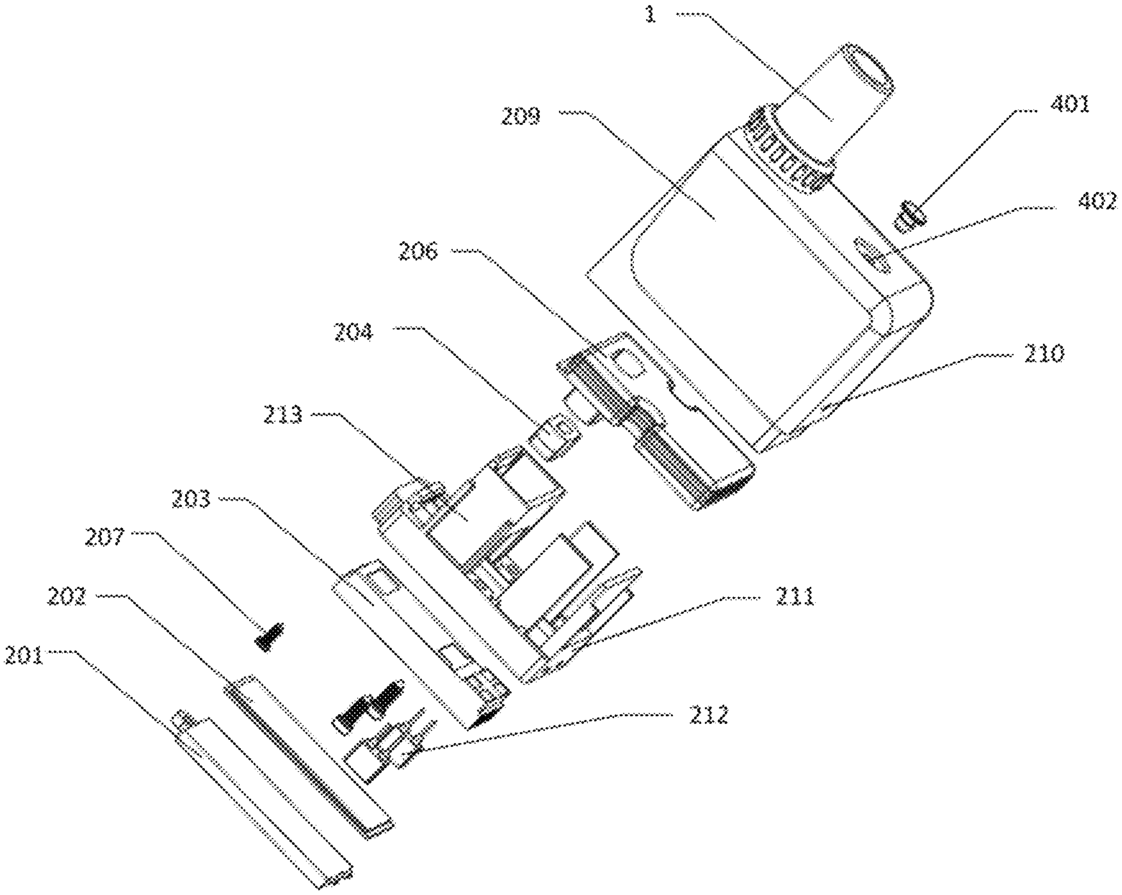
FIG. 4 is an exploded view of the atomizer of the present invention.

FIG. 3 and FIG. 4 show a cross-sectional view and an exploded view of the atomizer of the variable-frequency surface acoustic wave electronic cigarette of the present invention, respectively. The atomization chip 203 is placed in the atomization chip stopper 211, and the atomization cavity 213 is provided at the upper end of the atomization chip stopper 211. The e-liquid storage cavity 205 is provided at the lower end of the silicone sealing sheet 206. The porous ceramic sheet 204 employs a bowl-shaped structure with a convex portion around a middle recessed portion, and a size thereof are exactly matched with the lower port of the e-liquid storage cavity 205 to form a whole e-liquid storing and guiding structure. The assembled silicone sealing sheet 206 and porous ceramic sheet 204 are placed on the upper end of the atomization chip stopper 211. The e-liquid storage cavity 205 and the porous ceramic sheet 204 are exactly located in the atomization cavity 213. The porous ceramic sheet 204 is fitted with the upper surface of the atomization chip 203 to realize the supply and transmission of e-liquid. The magnetic thimble 212 is mounted at the right end of the atomization chip stopper 211, and is configured to access the drive signal source. The above assembly structure is placed in the atomizer housing 209, and a piece of silicone gasket 202 is pasted on the bottom of the above assembly structure to realize heat insulation and sealing. Finally, the bottom board 201 is covered, and the first screw 207 is screwed to fix the entire atomizer. The e-liquid is injected from the e-liquid injection round hole 402 on the top of the atomizer 2, and the entire e-liquid storage cavity 205 will be automatically fully filled after the e-liquid is injected. Finally, the silicone e-liquid injection hole plug 401 is inserted into the e-liquid injection round hole 402 for sealing. When the user performs a smoking action through the suction nozzle 1, the peripheral air flows in from the airflow inlet 210, and the airflow inlet 210 and the inverted trapezoidal interdigital transducer 2037 are on an identical horizontal plane. The air carries the e-liquid atomized smoke from the end surface of the porous ceramic sheet 204 disposed on the surface of the atomization chip 203 in the atomizer 2 to enter the suction nozzle 1 through the airflow channel 208 for the smoker to smoke.

In an embodiment, the electric core 3 of the above electronic cigarette further includes: the protective shell 301, the charging port 302, the stop body 303, the screw cap 304, the battery 305, the second screw 306, the circuit board 307 and the bottom cover 308. First, the circuit board 307 is placed in the stop body 303, and the battery 305 is placed at the lower part of the circuit board 307 to ensure that the charging port 302 of the circuit board 307 is aligned with the stop body 303. The button 5 is installed on a side of the protective shell 301 of the electric core 3, then the above assembly is placed in the protective shell 301, and the charging port is also ensured to be aligned with the charging port 302 of the bottom of the protective shell 301. The button 5 is connected to a button output port of the circuit board 307 through a wire. The magnetic thimble 212 is provided at the top of the protective shell 301, is connected to a signal output end of the circuit board 307 through the wire, and is fixed using the second screw 306 and the screw cap 304. After assembling, the indicator light 6 is exactly located on the lower right side of the protective shell 301 of the electric core 3. Finally, the bottom cover 308 is fastened to complete the assembling and connection of the electric core.

Figure 5:
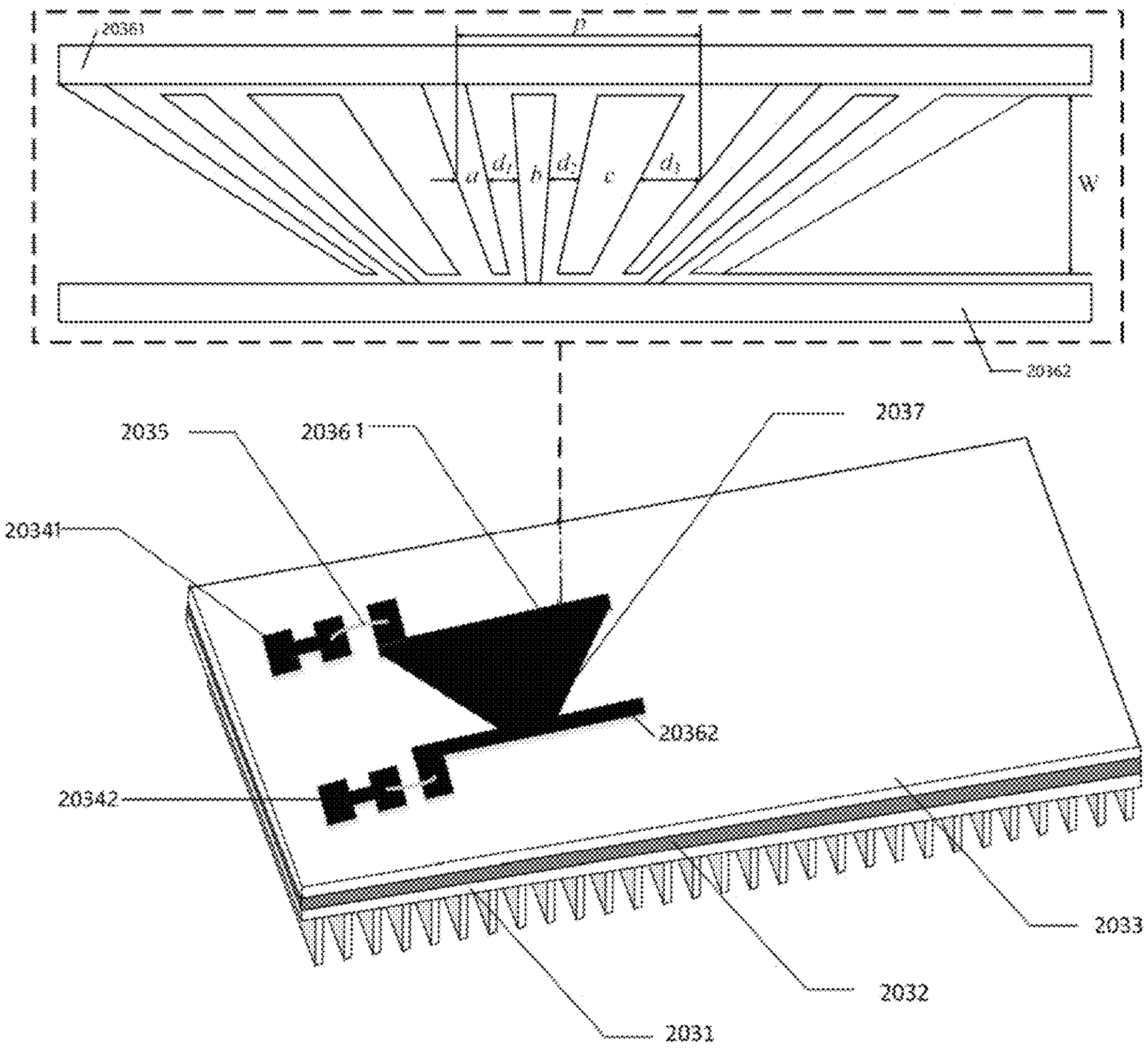
FIG. 5 is a schematic diagram of the structure of an atomization chip of the present invention.

FIG. 5 shows a schematic diagram of the structure of the atomization chip of the variable-frequency surface acoustic wave electronic cigarette of the present invention, The atomization chip successively includes: the heat sink 2031, the heat conduction layer 2032, the piezoelectric substrate layer 2033, the first PCB bonding pad 20341, the second PCB bonding pad 20342, the power connection wire 2035, and the inverted trapezoidal interdigital transducer 2037. The inverted trapezoidal interdigital transducer 2037 includes two metal electrode bus bars, namely the first metal electrode bus bar 20361 and the second metal electrode bus bar 20362. A plurality of first metal interdigital electrodes a are connected to the first metal electrode bus bar 20361 through a relatively long trapezoidal bottom, and a plurality of second metal interdigital electrodes b are connected to the second metal electrode bus bar 20362 through a relatively short trapezoidal bottom. The plurality of the first metal interdigital electrodes a and the plurality of the second metal interdigital electrodes b are arranged in a finger-crossed shape. The reflective electrode c is embedded between the first metal interdigital electrode a and the second metal interdigital electrode b, and the reflective electrode c is not connected to any metal electrode bus bar. Each of the inverted trapezoidal interdigital transducer 2037, the first PCB bonding pad 20341, the second PCB bonding pad 20342 and the piezoelectric substrate layer 2033 is adhered to the upper surface of the heat sink 2031 through the heat conduction layer 2032. The first PCB bonding pad 20341 and the second PCB bonding pad 20342 are connected to the first metal electrode bus bar 20361 and the second metal electrode bus bar 20362 using the power connection wire 2035 through the binding process, respectively. The other end of the first PCB bonding pad 20341 and the other end of the second PCB bonding pad 20342 are assembled and connected through the magnetic thimble 212 disposed between the atomizer 2 and the electric core 3 to realize the input of the signal source.

The upper part of FIG. 5 shows the partial enlarged view of the shape of the inverted trapezoidal interdigital transducer 2037. A frequency of the surface acoustic wave generated by the atomization chip 203 is determined by the structure of the inverted trapezoidal interdigital transducer 2037. The arrangement manner of the metal interdigital electrodes and the reflective electrodes is: the first metal interdigital electrode a, the first gap $d_1$, the second metal interdigital electrode b, the second gap $d_2$, the reflective electrode c, the third gap $d_3$, the first metal interdigital electrode a, . . . , and the above arrangement continues in a plurality of groups to constitute the inverted trapezoidal interdigital transducer 2037. The average width of the first gap $d_1$ is identical to the average width of the first metal interdigital electrode a. The average width of the second gap $d_2$ is identical to the average width of the second metal interdigital electrode b. The average width of the third gap $d_3$ is identical to the average width of the reflective electrode c. In the present embodiment, the shape of the first metal interdigital electrode a and the shape of the second metal interdigital electrode b are completely identical, wherein the sum of the average width of the first metal interdigital electrode a, the average width of the first gap $d_1$, the average width of the second metal interdigital electrode b, the average width of the second gap $d_2$, the average width of the reflective electrode c and the average width of the third gap $d_3$ is the wavelength p (i.e., $p=a+b+c+d_1+d_2+d_3$) of the surface acoustic wave, and it is satisfied that the average width of the first metal interdigital electrode a, or the average width of the first gap $d_1$, or the average width of the second metal interdigital electrode b or the average width of the second gap $d_2$ is one eighth of the wavelength of the surface acoustic wave (i.e., $a=b=d_1=d_2=p/8$), and the average width of the third gap $d_3$ or the average width of the reflective electrode c is a quarter of the wavelength of the surface acoustic wave (i.e., $c=d_3=p/4$). For example, in order to realize that the frequency range of the generated surface acoustic wave is 20 MHz-100 MHz, it is required that, within the W range of the inverted trapezoidal interdigital transducer 2037 (refer to the partial enlarged view at the upper part of FIG. 5), each of the uppermost end of the first metal interdigital electrode a, the uppermost end of the first gap $d_1$, the uppermost end of the second metal interdigital electrode b, and the uppermost end of the second gap $d_2$ takes a value of 15 μm, and each of the lowermost end of the first metal interdigital electrode a, the lowermost end of the first gap $d_1$, the lowermost end of the second metal interdigital electrode b, and the lowermost end of the second gap $d_2$ takes a value of 5 μm, that is, the change range of the wavelength is 200 μm-40 μm.

A method for using the variable-frequency surface acoustic wave electronic cigarette of the present invention includes the following steps.

The electric core 3 is externally connected to a charging wire through the charging port 302 to complete the charging of the battery. The e-liquid is injected through the e-liquid injection hole 4, and the e-liquid fills the e-liquid storage cavity 205, then permeates into the porous ceramic sheet 204 and finally reaches the surface of the atomization chip 203 and is locked. The atomizer 2 is connected to the electric core 3 through the magnetic thimble 212. After the button 5 is turned on, the signal source and the atomization chip 203 realize the signal input and communication. Based on the inverse piezoelectric effect of the piezoelectric substrate layer 2033, the input electric signal is converted into a mechanical vibration signal to generate a surface acoustic wave propagating along the surface of the piezoelectric substrate layer 2033. When the surface acoustic wave is transmitted to a contact area of the porous ceramic sheet 204, the surface acoustic wave sucks out the e-liquid locked by the porous ceramic sheet 204, and a liquid film is formed between the surface of the piezoelectric substrate layer 2033 and the end surface of the porous ceramic sheet 204. The energy of the surface acoustic wave is diffracted into the liquid film of the e-liquid to produce an acoustic streaming effect and form an acoustic streaming force. The acoustic streaming force overcomes the surface tension and viscosity force of the liquid film of the e-liquid to enable the e-liquid to produce the smoke with a nano-sized particle size. Suction is performed through the suction nozzle 1, and the peripheral air flows in from the airflow inlet 210, flows through the e-liquid atomization area, and transmits the atomized smoke into the mouth of the user along the airflow channel 208 and the suction nozzle 1.

After the button 5 is long pressed to reach 5 s, the electric core 3 automatically stops the output to prevent excessive suction. The signal can be output normally by long pressing the button 5 again, so that the connected atomization chip 203 works normally and completes the atomization of the e-liquid. In a power-on state, the button 5 is pressed twice within 0.5 s to enter a frequency cycle adjustment mode. Each time the button 5 is pressed twice, the frequency is stepped by 10 MHz, there is a cycle of nine grades between 20 MHz-100 MHz, and the particle size of the particle obtained after atomization of the e-liquid can be adjusted arbitrarily. Of course, the frequency range and the grades can also be selected as other settings. When it is powered on again, the electronic cigarette starts the running according to the set data retained when it is powered off at the last time.

If there is not any operation within 40 s in the power-on state, the electric core 3 enters a standby power saving mode. After the button 5 is continuously pressed five times within 2 s in the power-on state, the electric core 3 is powered off, and the indicator light 6 flashes red for prompt. In the whole process, the indicator light 6 displays different colors according to the electric quantity of the battery from high to low, such as green (electric quantity>70%), blue (electric quantity between 70% and 30%), and red (electric quantity<30%). If the electric quantity of the battery is lower than 10% during use, the indicator light will flash and the electronic cigarette will automatically power off.

The atomization chip can also work in a continuous frequency range, such as 20 MHz-100 MHz, and each frequency point corresponds to one smoke particle size after atomization of the e-liquid. According to the taste of the user, the smoke particle sizes can be set arbitrarily to obtain different smoke particle sizes.

The above only describes preferred embodiments of the present invention, and is not used to limit the present invention. For those skilled in the art, any modification, equivalent replacement, improvement and others made without exerting any creative effort according to the technical solutions or technical features disclosed in the present invention shall fall within the scope of protection of the present invention.

What is claimed is:

1. A variable-frequency surface acoustic wave electronic cigarette, comprising an atomizer; wherein an atomization cavity is disposed in the atomizer, and a variable-frequency surface acoustic wave atomization chip is disposed at a lower portion of the atomization cavity; an inverted trapezoidal interdigital transducer is disposed on the variable-frequency surface acoustic wave atomization chip; an e-liquid storage cavity is disposed in the atomization cavity; and a porous ceramic sheet is disposed between the e-liquid storage cavity and the atomization chip;

wherein the inverted trapezoidal interdigital transducer comprises a plurality of metal interdigital electrodes and reflective electrodes, which are in an inverted trapezoidal shape; the inverted trapezoidal interdigital transducer further comprises two metal electrode bus bars, namely a first metal electrode bus bar and a second metal electrode bus bar; a plurality of first metal interdigital electrodes are connected to the first metal electrode bus bar through a relatively long trapezoidal bottom, and a plurality of second metal interdigital electrodes are connected to the second metal electrode bus bar through a relatively short trapezoidal bottom; the plurality of first metal interdigital electrodes and the plurality of second metal interdigital electrodes are arranged in a finger-crossed shape, and a reflective electrode is embedded between a first metal interdigital electrode and a second metal interdigital electrode.

2. The variable-frequency surface acoustic wave electronic cigarette of claim 1, wherein an arrangement manner of the metal interdigital electrodes and reflective electrodes is: the first metal interdigital electrode, a first gap, the second metal interdigital electrode, a second gap, the reflective electrode, a third gap, the first metal interdigital electrode, . . . ; the above arrangement continues in a plurality of groups to constitute the inverted trapezoidal interdigital transducer; an average width of the first gap is identical to an average width of the first metal interdigital electrode; an average width of the second gap is identical to an average width of the second metal interdigital electrode; and an average width of the third gap is identical to an average width of the reflective electrode.

3. The variable-frequency surface acoustic wave electronic cigarette of claim 2, wherein a shape of the first metal interdigital electrode and a shape of the second metal interdigital electrode are identical; a sum of the average width of the first metal interdigital electrode, the average width of the first gap, the average width of the second metal interdigital electrode, the average width of the second gap, the average width of the reflective electrode and the average width of the third gap of the surface acoustic wave; it is satisfied that the average width of the first metal interdigital electrode, or the average width of the first gap, or the average width of the second metal interdigital electrode or the average width of the second gap is one eighth of the wavelength of the surface acoustic wave, and the average width of the third gap or the average width of the reflective electrode is a quarter of the wavelength of the surface acoustic wave.

4. The variable-frequency surface acoustic wave electronic cigarette of claim 1, wherein the atomization chip successively comprises: a heat sink layer, a heat conduction layer and a piezoelectric substrate layer; the inverted trapezoidal interdigital transducer is disposed on the piezoelectric substrate layer; two separate printed circuit board (PCB) bonding pads, namely a first PCB bonding pad and a second PCB bonding pad, are disposed on the piezoelectric substrate layer; the first metal electrode bus bar is connected to the first PCB bonding pad through a power connection wire, and the second metal electrode bus bar is connected to the second PCB bonding pad through a power connection wire.

5. The variable-frequency surface acoustic wave electronic cigarette of claim 4, further comprising an electric core; wherein a circuit board and a battery are disposed in the electric core, and the electric core is conductively connected to the first PCB bonding pad and the second PCB bonding pad through a magnetic thimble.

6. The variable-frequency surface acoustic wave electronic cigarette of claim 1, wherein the atomizer is provided with an atomizer housing; an airflow channel is disposed inside the atomizer housing, and a suction nozzle is disposed outside the atomizer housing; the suction nozzle is in communication with and connected to the airflow channel; an airflow inlet is formed on the atomizer housing, and the airflow inlet and the inverted trapezoidal interdigital transducer are on an identical horizontal plane.

7. The variable-frequency surface acoustic wave electronic cigarette of claim 5, further comprising a protective shell; wherein the electric core is disposed in the protective shell; and a button, an indicator light and a charging port are disposed outside the protective shell.

* * * * *